United States Patent
Mullins, Jr. et al.

(10) Patent No.: US 11,101,789 B2
(45) Date of Patent: Aug. 24, 2021

(54) SYSTEMS AND METHODS FOR PROVIDING BI-DIRECTIONAL SIGNAL LEVEL SHIFTING

(71) Applicant: Rockwell Automation Technologies, Inc., Mayfield Heights, OH (US)

(72) Inventors: Paul V. Mullins, Jr., Salem, NH (US); Gabriel J. Kuenn, Medford, MA (US)

(73) Assignee: ROCKWELL AUTOMATION TECHNOLOGIES, INC., Mayfield Heights, OH (US)

( * ) Notice: Subject to any disclaimer, the term of this patent is extended or adjusted under 35 U.S.C. 154(b) by 0 days.

(21) Appl. No.: 16/721,120

(22) Filed: Dec. 19, 2019

(65) Prior Publication Data

US 2021/0194471 A1 Jun. 24, 2021

(51) Int. Cl.
*H03K 3/356* (2006.01)
*F16P 3/00* (2006.01)

(52) U.S. Cl.
CPC .......... *H03K 3/356017* (2013.01); *F16P 3/00* (2013.01)

(58) Field of Classification Search
None
See application file for complete search history.

(56) References Cited

U.S. PATENT DOCUMENTS

| | | | |
|---|---|---|---|
| 5,877,633 A | | 3/1999 | Richard |
| 6,005,415 A | * | 12/1999 | Solomon .............. H03K 17/102 326/112 |
| 10,128,848 B2 | * | 11/2018 | Matsubara ..... H03K 19/018521 |
| 10,411,678 B2 | * | 9/2019 | Wu .................. H03K 3/356113 |
| 2003/0001655 A1 | * | 1/2003 | Jeong .............. H03K 3/356113 327/333 |
| 2003/0132794 A1 | | 7/2003 | Watanabe |
| 2005/0057296 A1 | * | 3/2005 | Dharne ............ H03K 3/356113 327/333 |
| 2009/0243695 A1 | | 10/2009 | Thoma |

OTHER PUBLICATIONS

European Patent Office, "Communication pursuant to Rule 64 EPC, Partial European Search Report", application No. 20212729.6, EPO, dated May 19, 2021, 13 pages.

* cited by examiner

*Primary Examiner* — Lincoln D Donovan
*Assistant Examiner* — Khareem E Almo

(57) ABSTRACT

A bi-directional level shift circuit shifts signal levels between a first signal line and a second signal line. The circuit includes a first transistor and a second transistor. The first transistor includes a first gate connected to the second signal line, a first source connected to the first signal line, and a first drain connected to a voltage rail which supplies voltage. The second transistor includes a second gate connected to the voltage rail, a second source connected to the first signal line, and a second drain connected to the second signal line.

17 Claims, 3 Drawing Sheets

SYSTEMS AND METHODS FOR PROVIDING BI-DIRECTIONAL SIGNAL LEVEL SHIFTING

U.S. patent application Ser. No. 14/580,178 (granted as U.S. Pat. No. 9,797,552), "Diagnostics and Enhanced Functionality for Single-Wire Safety Communication," which was filed on Dec. 22, 2014, is incorporated herein by reference in its entirety.

TECHNICAL FIELD

This application relates generally to systems and methods for providing signal level shifting, and, more particularly relates to systems and methods for providing bi-directional signal level shifting and providing high drive capability for capacitive loads.

BACKGROUND

Industrial safety systems (e.g., systems powered by 24V) with single-wire safety architecture utilize multiple safety devices to provide safety control and monitoring. The single-wire safety architecture allows signals transmitting through the safety devices bi-directionally. The signal level drops during transmission through the safety devices, and a power supply is provided at one or more desired locations between safety devices to maintain a desired signal level during the bi-directional transmission.

SUMMARY

The following presents a simplified summary of the claimed subject matter in order to provide a basic understanding of some aspects described herein. This summary is not an extensive overview and is not intended to identify key/critical elements or to delineate the scope of the claimed subject matter. Its sole purpose is to present some concepts in a simplified form as a prelude to the more detailed description that is presented later.

One embodiment of the disclosure relates to a bi-directional level shift circuit. The circuit shifts signal levels between a first signal line and a second signal line. The circuit includes a first transistor and a second transistor. The first transistor includes a first gate connected to the second signal line, a first source connected to the first signal line, and a first drain connected to a voltage rail which supplies voltage. The second transistor includes a second gate connected to the voltage rail, a second source connected to the first signal line, and a second drain connected to the second signal line.

Another embodiment of the disclosure relates to a power supply device. The power supply device includes a first terminal, a second terminal, a third terminal, and a bi-directional shift circuit. The first terminal is connected to an upstream device. The second terminal is connected to a downstream device. The third terminal is connected to a power source supplying voltage at a constant level. The bi-directional shift circuit includes a first transistor and a second transistor. The first transistor includes a first gate connected to a signal line of the downstream device, a first source connected to a signal line of the upstream device, and a first drain connected to a voltage rail of the upstream device. The second transistor includes a second gate connected to the voltage rail of the upstream device, a second source connected to the signal line of the upstream device, and a second drain connected to the signal line of the downstream device.

Another embodiment of the disclosure relates to a safety system. The safety system includes an upstream device, a downstream device, and a power supply device disposed between the upstream device and the downstream device. The power supply device includes a first terminal, a second terminal, a third terminal, and a bi-directional shift circuit. The first terminal is connected to an upstream device. The second terminal is connected to a downstream device. The third terminal is connected to a power source supplying voltage at a constant level. The bi-directional shift circuit includes a first transistor and a second transistor. The first transistor includes a first gate connected to a signal line of the downstream device, a first source connected to a signal line of the upstream device, and a first drain connected to a voltage rail of the upstream device. The second transistor includes a second gate connected to the voltage rail of the upstream device, a second source connected to the signal line of the upstream device, and a second drain connected to the signal line of the downstream device.

The following description and annexed drawings set forth certain illustrative aspects of the specification. These aspects are indicative, however, of but a few of the various ways in which the principles of the specification can be employed. Other advantages and novel features of the specification will become apparent from the following detailed description of the specification when considered in conjunction with the drawings.

DETAILED DESCRIPTION

Various aspects are now described with reference to the drawings. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing these aspects.

Figure 1:
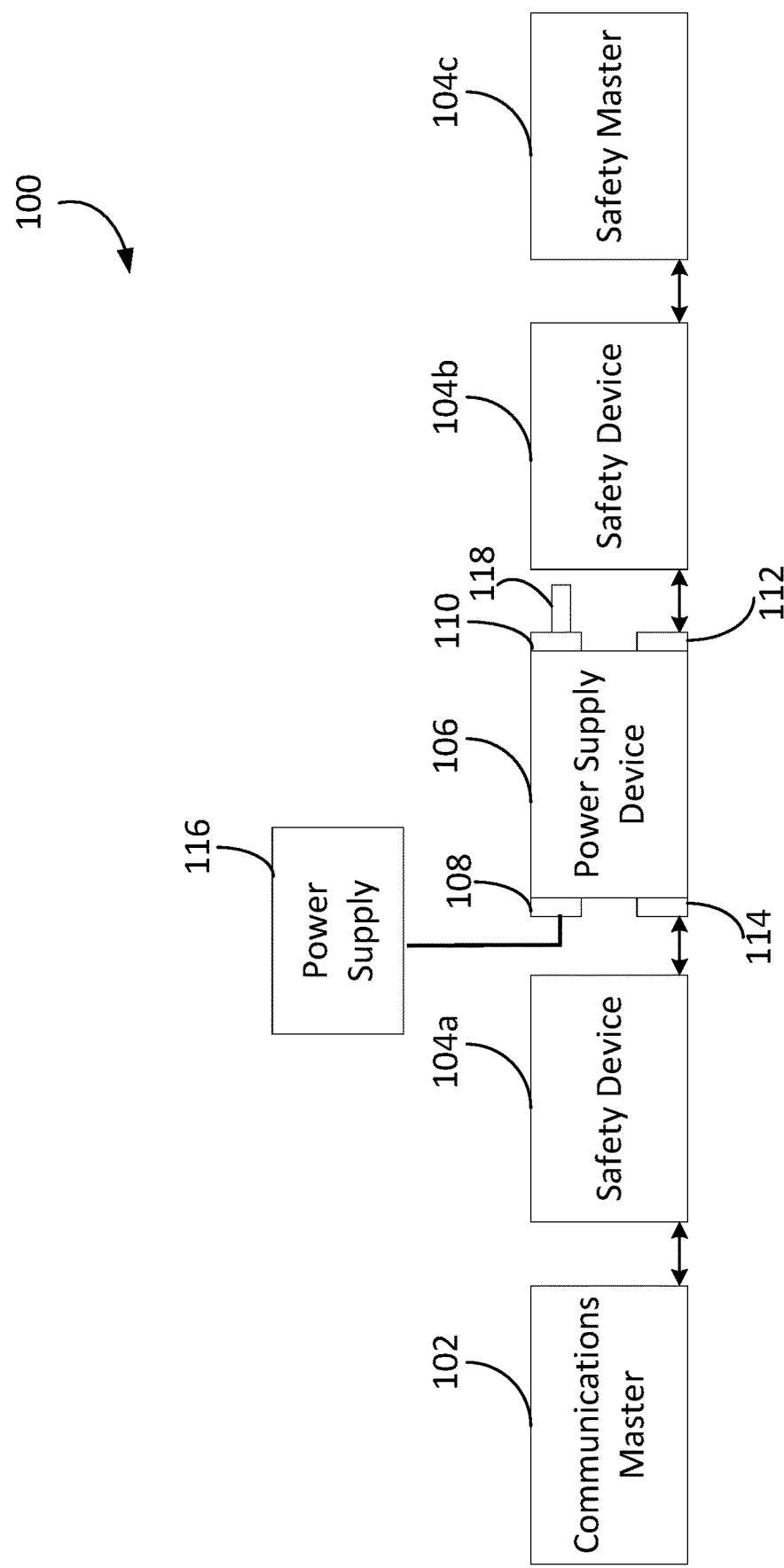
FIG. 1 is a block diagram of a safety system according to an illustrative embodiment.

Referring to FIG. 1, a block diagram of a safety system 100 is shown according to an illustrative embodiment. The safety system 100 is configured to provide safety device monitoring and controlling according to some embodiments. The safety system 100 includes a safety relay acting as a communications master 102, one or more safety devices 104a, 104b, and 102c, and a power supply device 106 connected in series using a single wire according to some embodiments. The safety devices 104a, 104b, 104c, and the power supply device 106 are configured to compliance with a single-wire safety communication protocol according to some embodiments.

For example, the safety device 104c, which is farthest from the communications master 102 in the communication chain, serves as a safety master. The safety master 104c generates a defined pulse train that is passed through each safety device in the chain to the communications master 102. The communications master 102 remains in operational mode as long as the defined pulse train is recognized. The total path between the safety master 104c and the communications master 102 includes a single-wire safety plus link, which is made up of multiple sub-links between adjacent safety devices (e.g., safety devices 104c and 104b), and sub-links between adjacent safety device and the power device (e.g., the safety device 104b and the power device 106). When one of the safety devices identifies the loss of its safety function (e.g., opening of a safety gate, pressing of an emergency stop button, etc.) and enters the safe state, the safety device ceases to pass the pulse train to upstream devices, preventing the signal from reaching the communications master 102. Upon detecting loss of the pulse train signal, the communications master 102 isolates power to the industrial system components (e.g., machine, industrial device, motor, etc.).

In some embodiments, The safety system 100 implements a bi-directional communication protocol on the single-wire safety channel, allowing the devices in the chain to share information, including but not limited to status data, address information, presence indication, etc., via the same channel over which the pulsed signal is sent. For example, the single-wire protocol allows the safety devices to exchange request and response messages over the channel, while coordinating sending and receiving of these messages with transmission of the pulse train.

While the pulse train level transmits through one or more safety devices (e.g., from upstream safety device 104b to downstream safety device 104a), the pulse train level may drop. When the pulse train level drops to or below a threshold level, the power supply device (e.g., the power supply device 106) is installed in the communication chain to supply power to the downstream devices and so that the pulse train can still be transmitted to and from the safety master 104c. In some embodiments, one or more power supply devices are installed in the communication chain. For example, a power supply device is installed at each location where the pulse train level drops to or below the threshold level according to some embodiments. More details of the power supply device are described herein.

The power supply device 106 is configured to supply power to the pulse train in order to boost the pulse train level to a desired level. In some embodiments, where the power supply is inserted into the safety system 100 may cause a signal level difference that needs to be shifted down as it transmits upstream to the next safety device. For example, the signal level difference may be in the range of 20V to 30V according to some embodiments. As described above, signals can be transmitted bi-directionally on the communication train, the power supply device 106 is thus configured to shift the level of signal transmitted through the power supply device from both directions (e.g., upstream and downstream directions). The power supply device 106 includes terminals 108, 110, 112, and 114, according to some embodiments. The terminal 108 is connected to a power supply 116 (e.g., 24 V power supply). The power supply 116 provides a constant power level supply. The terminal 110 is used for a single wire safety enabled device. In some embodiments, the terminal 110 is connected to a shorting plug 118 to allow the communication signal to pass through the terminal 110 to the terminal 112. The terminal 112 is connected to a downstream safety device (e.g., the safety device 104b). The terminal 114 is connected to an upstream safety device (e.g., the safety device 104a). The terminal 114 and the terminal 112 are used to transmit and/or receive signals. Although not shown in the figures, it should be understood that each terminal may have multiple ports (e.g., signal port, ground port, power port, etc.).

Figure 2:
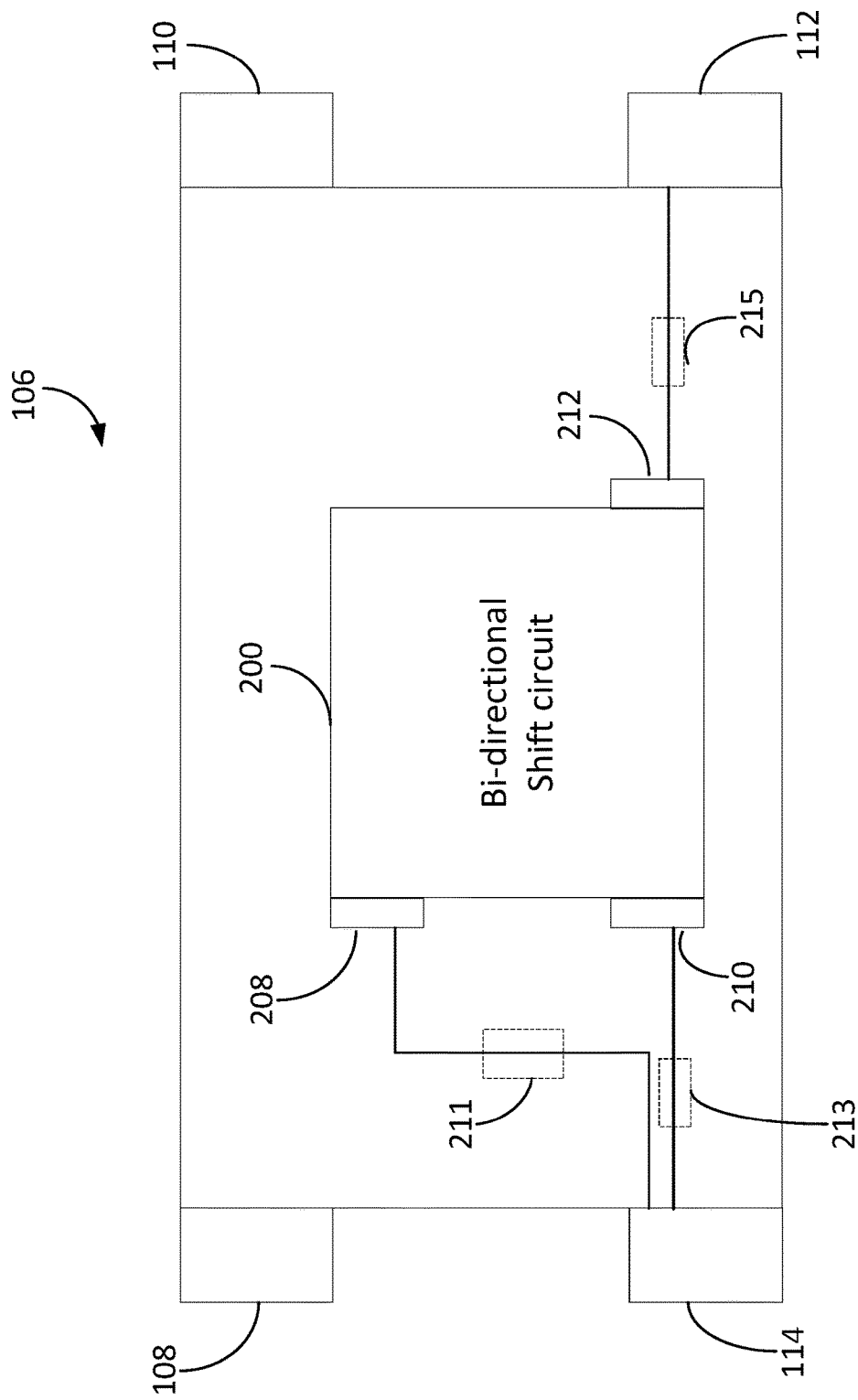
FIG. 2 is a block diagram of a power supply device used in the safety system of FIG. 1 according to an illustrative embodiment.

Referring to FIG. 2, a block diagram of a power supply device is shown according to an illustrative embodiment. The power supply device is configured to supply power for a safety system according to some embodiments. The power supply device may be used as the power supply device 106 as described above with reference to FIG. 1. The power supply device 106 includes a bi-directional shift circuit 200 configured to bi-directionally shifting signal levels.

The bi-directional shift circuit 200 includes a first terminal 208, a second terminal 210, and a third terminal 212, according to some embodiments. The first terminal 208 is configured to connect to a first port of the terminal 114 of the power supply device 106. The first terminal 208 receives power supply from the first port of the terminal 114. In some embodiments, the first terminal 208 is connected to the terminal 114 through a filter 211. The filter 211 is configured to filter the input and/or output signal according to some embodiments. The second terminal 210 transmits and/or receives signal to/from an upstream safety device (e.g., the safety device 104a) through the first port of the terminal 114. In some embodiments, the second terminal 210 is connected to the terminal 114 through a filter 213. The filter 213 is configured to filter the input and/or output signal according to some embodiments. The third terminal 212 is configured to connect to a port of the third terminal 112 to transmit and/or receive signal to/from a downstream safety device through the third terminal 112. Although not shown in the figures, it should be understood that the terminals 108, 110, 112, and 114 may include ports for grounding, power supply, etc.

Figure 3:
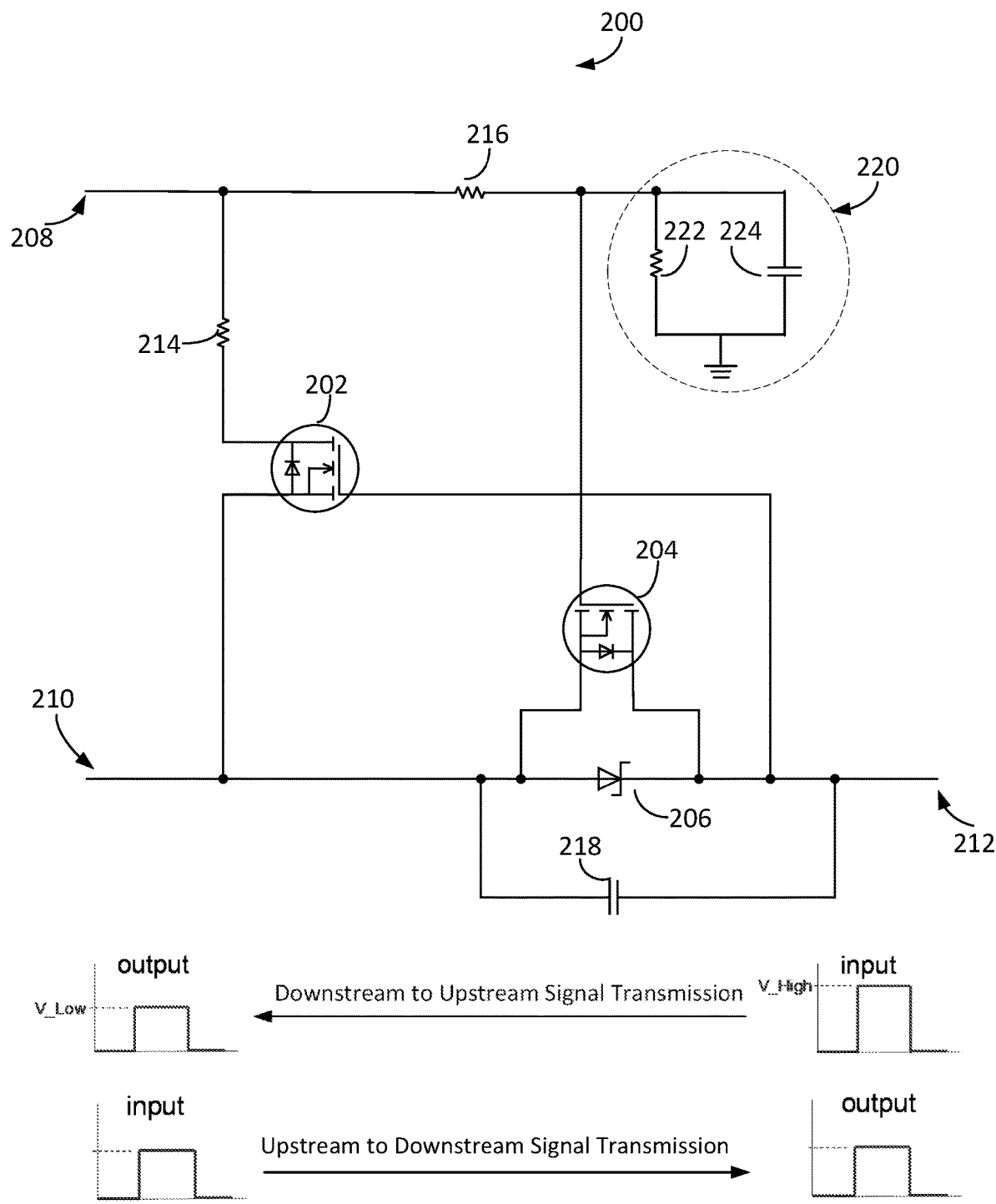
FIG. 3 depicts a bi-directional shift circuit used in the power supply device of FIG. 2 according to an illustrative embodiment

Referring to FIG. 3, the bi-directional shift circuit 200 is shown according to an illustrative embodiment. The bi-directional shift circuit 200 is configured to providing bi-direction level shifting. The bi-directional shift circuit 200 can be used in the power supply device 106 to shift signal levels to a desired voltage range bi-directionally with high speed and high drive capability. For example, the bi-directional shift circuit 200 is configured to shift high voltages down in the 20V to 30V range while providing high speed drive capability for capacitive loads. In some embodiments, the bi-directional shift circuit 200 is configured to shift high voltages down to a level that is higher than 30V. In some embodiments, the bi-directional shift circuit 200 is implemented as an integrated circuit.

The bi-directional shift circuit 200 is configured to provide bi-directional level shift for signals received at the second terminal 210 and signals received at the third terminal 212 according to some embodiments. In some embodiments, the second terminal 210 is connected to the upstream safety device (e.g., safety device 104a) and the third terminal 212 is connected to the downstream safety device (e.g., safety device 104b). And thus, the signal received at the second terminal 210 has a lower voltage level than the signal received at the third terminal 212. In some embodiments, the bi-directional shift circuit 200 downshifts signal received at the third terminal 212 and outputs to the second terminal 210.

As shown in FIG. 3, the bi-directional shift circuit 200 includes a first transistor 202, a second transistor 204, and a diode 206. The transistors 202 and 204 are shown to be N-type MOS transistor. However, it should be understood that any appropriate type of transistors can be used herein with or without adaption. The first terminal 208 is connected to a drain of the first transistor 202 through a first resistor 214, according to some embodiments. A source of the first transistor 202 is connected to the second terminal 210, according to some embodiments. A gate of the first transistor 202 is connected to the third terminal 212.

The first terminal 208 is connected to a gate of the second transistor 204 through a second resistor 216, according to some embodiments. A source of the second transistor 204 is connected to the second terminal 210, according to some embodiments. A drain of the second transistor 204 is connected to the third terminal 212, according to some embodiments. In some embodiments, the diode 206 is connected in forward biased between the second terminal 210 and the third terminal 212 and is in parallel connection with the second transistor 204. In some embodiments, the external diode 206 may be omitted and the internal diode of the second transistor 204 is used. A capacitor 218 is connected between the second terminal 210 and the third terminal 212 and is in parallel connection with the diode 206, according to some embodiments.

In operation, when a signal (e.g., a pulse) is received at the second terminal 210, an initial level at the second terminal 210 and the third terminal 212 are both 0V. Since the first terminal 208 receives the power supply rail from an upstream safety device (e.g., the safety device 104a), the voltage level of the signal is relatively lower (e.g., 20V). The lower voltage supply is provided at the gate of the second transistor 204 so that the transistor 204 is fully ON (e.g., conductive). The level at the gate of the first transistor 202 is the same as the third terminal 212, so that initially the transistor first 202 is fully OFF (e.g., nonconductive).

With the second transistor 204 being ON, the input signal received at the second terminal 210 passes to the third terminal 212 through the conductive transistor 204 (and the diode 206) so that the level at the third terminal 212 increases as the level at the second terminal increases. When the input signal level at the second terminal 210 is increased to a level that equals to the level at the first terminal 208 (e.g., the level at the gate of the second transistor 204) minus a turn on voltage of the transistor 204, the transistor 204 is turned OFF and the diode inside of the second transistor 204 and the diode 206 remain on to maintain the input signal level close to a full signal level. When the signal received at the second terminal 210 decreases back to 0V, the second transistor 204 is turned back on, and thus the signal output to the third terminal 212 is also 0V.

In the opposite direction, when a signal (e.g., a pulse) is received at the third terminal 212, an initial input signal level at the third terminal 212 and an initial output signal level at the second terminal 210 are both 0V. Since the third terminal 212 receives signal from a downstream safety device (e.g., the safety device 104b), the voltage level of the signal is relatively higher (e.g., 26V). In some embodiments, the voltage level of the signal from the downstream safety device is between 20V and 30V. In some embodiments, the voltage level of the signal from the downstream safety device is above 30V. Initially, the second transistor 204 is fully ON because the lower voltage power supply is applied on the gate of the transistor 204. The first transistor 202 is fully OFF initially because the gate level is 0V from the third terminal 212.

The input signal received at the third terminal 212 thus passes to the second terminal 210 through the second transistor 204. The output signal level changes along with the input signal level. As the input signal level received at the third terminal 212 increases, the output signal level at the second terminal 210 increases as well. When the output signal level increases to a level that equals the level at the gate terminal of the second transistor 204, the transistor 204 is turned OFF. When the input level at the third terminal 212 increases to a threshold level of the gate of the first transistor 202, the transistor 202 is turned ON. When the first transistor 202 is turned on, the level at the second terminal 210 is pulled up to the power supply level at the first terminal 208. In this way, the level at the second terminal 210 goes up to the level at the first terminal 208 as a maximum level. When the signal level at the third terminal 212 continues increasing to a level higher than the signal level at the first terminal 208, the signal level at the second terminal 210 stays at the signal level at the first terminal 208 because the second transistor 204 is turned OFF according to some embodiments.

In some embodiments, the bi-directional shift circuit 200 includes a voltage divider component 220 configured to reduce voltage at the gate of the transistor when a potential voltage at the gate is above a threshold level in order to protect the transistor 204 from overloaded. The voltage divider component 220 includes a resistor 222 and capacitor 224. In some embodiments, the protector component 220 is optional and can be removed from the bi-directional shift circuit 200. For example, when the potential voltage at the gate of the transistor 204 is below the threshold level, the voltage divider component 220 is removed from the bi-directional shift circuit 200 according to some embodiments.

In addition, the bi-directional circuit 300 can shift high voltage in various range (e.g., voltage higher than 30V, voltage 20V-30V) depending on the parameters of the transistors 202 and 204.

The subject matter as described above includes various exemplary aspects. However, it should be appreciated that it is not possible to describe every conceivable component or methodology for purposes of describing these aspects. One of ordinary skill in the art can recognize that further combinations or permutations can be possible. Various methodologies or architectures can be employed to implement the various embodiments, modifications, variations, or equivalents thereof. Accordingly, all such implementations of the aspects described herein are intended to embrace the scope and spirit of subject claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A bi-directional level shift circuit shifting signal levels between a first signal line and a second signal line the circuit comprising:
   a first transistor comprising a first gate connected to the second signal line, a first source connected to the first signal line, and a first drain connected to a voltage rail which supplies voltage;
   a second transistor comprising a second gate connected to the voltage rail, a second source connected to the first signal line, and a second drain connected to the second signal line; and
   a diode connected in forward biased between the first signal line and the second signal line in parallel with an internal diode of the second transistor.

2. The circuit of claim 1, wherein the first transistor and the second transistor are N-type MOFET.

3. The circuit of claim 1, wherein a voltage level of signals input from the first signal line is lower than a voltage level of signals input from the second signal line.

4. A bi-directional level shift circuit shifting signal levels between a first signal line and a second signal line the circuit comprising:
   a first transistor comprising a first gate connected to the second signal line, a first source connected to the first signal line, and a first drain connected to a voltage rail which supplies voltage; and
   a second transistor comprising a second gate connected to the voltage rail, a second source connected to the first signal line, and a second drain connected to the second signal line, wherein the first drain is connected to the voltage rail through a first resistor, and the second gate is connected to the voltage rail through a second resistor.

5. The circuit of claim 1, wherein in response to receiving a pulse at the second signal line, the bi-directional level shift circuit outputs a pulse at the first signal line, wherein a level of the pulse at the first signal line equals to a level of the voltage supplied by the voltage rail.

6. The circuit of claim 1, wherein in response to receiving a pulse at the first signal line, the bi-directional level shift circuit outputs a pulse at the second signal line, wherein a level of the pulse at the second signal line is substantially the same as a level of the pulse at the first signal line.

7. A power supply device, comprising:
   a first terminal connected to an upstream device;
   a second terminal connected to a downstream device;
   a third terminal connected to a power source supplying voltage at a constant level; and
   a bi-directional shift circuit which comprises:
      a first transistor comprising a first gate connected to a signal line of the downstream device, a first source connected to a signal line of the upstream device, and a first drain connected to a voltage rail of the upstream device; and
      a second transistor comprising a second gate connected to the voltage rail of the upstream device, a second source connected to the signal line of the upstream device, and a second drain connected to the signal line of the downstream device, wherein the bi-directional shift circuit further comprises a diode connected in forward biased between the signal line of the upstream device and the signal line of the downstream device in parallel with an internal diode of the second transistor.

8. The power supply device of claim 7, wherein a voltage level of signals input from the signal line of the upstream device is lower than a voltage level of signals input from the signal line of the downstream device.

9. The power supply device of claim 8, wherein the voltage level of signals input from the signal line of the downstream device is higher than 20V.

10. The power supply device of claim 7, wherein the first drain is connected to the voltage rail through a first resistor, and the second gate is connected to the voltage rail through a second resistor.

11. The power supply device of claim 7, wherein in response to receiving a pulse at the signal line of the downstream device, the bi-directional level shift circuit outputs a pulse at the signal line of the upstream device, wherein a level of the pulse at the signal line of the upstream device equals to a level of the voltage supplied by the voltage rail.

12. The power supply device of claim 7, wherein in response to receiving a pulse at the signal line of the upstream device, the bi-directional level shift circuit outputs a pulse at the signal line of the downstream device, wherein a level of the pulse at the signal line of the downstream device is substantially the same as a level of the pulse at the signal line of the upstream device.

13. A safety system comprising:
   an upstream device;
   a downstream device; and
   a power supply device disposed between the upstream device and the downstream device, wherein the power supply device comprises:
      a first terminal connected to the upstream device;
      a second terminal connected to the downstream device;
      a third terminal connected to a power source supplying voltage at a constant level; and
      a bi-directional shift circuit which comprises:
         a first transistor comprising a first gate connected to a signal line of the downstream device, a first source connected to a signal line of the upstream device, and a first drain connected to a voltage rail of the upstream device; and
         a second transistor comprising a second gate connected to the voltage rail of the upstream device, a second source connected to the signal line of the upstream device, and a second drain connected to the signal line of the downstream device, wherein the bi-directional shift circuit further comprises a diode connected in forward biased between the signal line of the upstream device and the signal line of the downstream device in parallel with an internal diode of the second transistor.

14. The safe system of claim 13, wherein the bi-directional shift circuit further comprises a voltage divider configured to connect between the second gate and the voltage rail of the upstream device.

15. The safe system of claim 13, wherein a voltage level of signals input from the signal line of the upstream device is lower than a voltage level of signals input from the signal line of the downstream device.

16. The safe system of claim 13, further comprising a downstream end device configured to generate signals to pass through the upstream device and the power supply device to an upstream end device.

17. The safe system of claim 16, wherein the upstream end device remains an operational mode in response to recognizing the signals generated by the downstream end device.

* * * * *